US012618137B2

(12) United States Patent
Mücke

(10) Patent No.: US 12,618,137 B2
(45) Date of Patent: May 5, 2026

(54) COATING METHOD AND DEVICE

(71) Applicant: Bühler Alzenau GmbH, Alzenau (DE)

(72) Inventor: Michael Mücke, Wöllstadt (DE)

(73) Assignee: BÜHLER ALZENAU GMBH,
Alzenau (DE)

( * ) Notice: Subject to any disclaimer, the term of this patent is extended or adjusted under 35 U.S.C. 154(b) by 86 days.

(21) Appl. No.: 18/002,785

(22) PCT Filed: Jun. 25, 2021

(86) PCT No.: PCT/EP2021/025236
§ 371 (c)(1),
(2) Date: Dec. 21, 2022

(87) PCT Pub. No.: WO2021/259521
PCT Pub. Date: Dec. 30, 2021

(65) Prior Publication Data
US 2023/0243028 A1 Aug. 3, 2023

(30) Foreign Application Priority Data

Jun. 26, 2020 (EP) ..................................... 20182452

(51) Int. Cl.
*C23C 14/04* (2006.01)
*C23C 14/14* (2006.01)
*C23C 14/24* (2006.01)
*C23C 14/56* (2006.01)

(52) U.S. Cl.
CPC ............ *C23C 14/042* (2013.01); *C23C 14/14* (2013.01); *C23C 14/24* (2013.01); *C23C 14/562* (2013.01)

(58) Field of Classification Search
CPC ....... C23C 14/042; C23C 14/14; C23C 14/24; C23C 14/562
See application file for complete search history.

(56) References Cited

U.S. PATENT DOCUMENTS

| | | | |
|---|---|---|---|
| 3,498,259 | A | 3/1970 | Braguier |
| 2007/0259105 | A1 | 11/2007 | Hayashi et al. |
| 2018/0066362 | A1 | 3/2018 | Okami |

FOREIGN PATENT DOCUMENTS

| | | |
|---|---|---|
| DE | 3212381 A1 | 11/1982 |
| DE | 4140891 A1 | 6/1993 |
| EP | 1400990 A1 | 3/2004 |
| EP | 2119813 A1 | 11/2009 |
| JP | 2012-092392 A | 5/2012 |
| JP | 2018-031038 A | 3/2018 |
| WO | 2006/088024 A1 | 8/2006 |

OTHER PUBLICATIONS

English machine translation of Kojima et al. (JP2012-092392).*

* cited by examiner

*Primary Examiner* — Robert S Walters, Jr.
(74) *Attorney, Agent, or Firm* — Colson Law Group, PLLC

(57) ABSTRACT

The invention relates to a method and a device for coating a strip-type, flexible, dielectric substrate with a metal layer on a coating roll over which the substrate is guided in the longitudinal direction of the substrate during the coating process. In order to improve the adhesion of the substrate on the coating roll during the coating process, the substrate is charged. The substrate is coated with a first metal layer, wherein, in the longitudinal direction of the substrate, at least one free strip remains which is not coated with the metal layer, and the coated substrate is provided with a second metal layer.

9 Claims, 2 Drawing Sheets

COATING METHOD AND DEVICE

Figure 1:
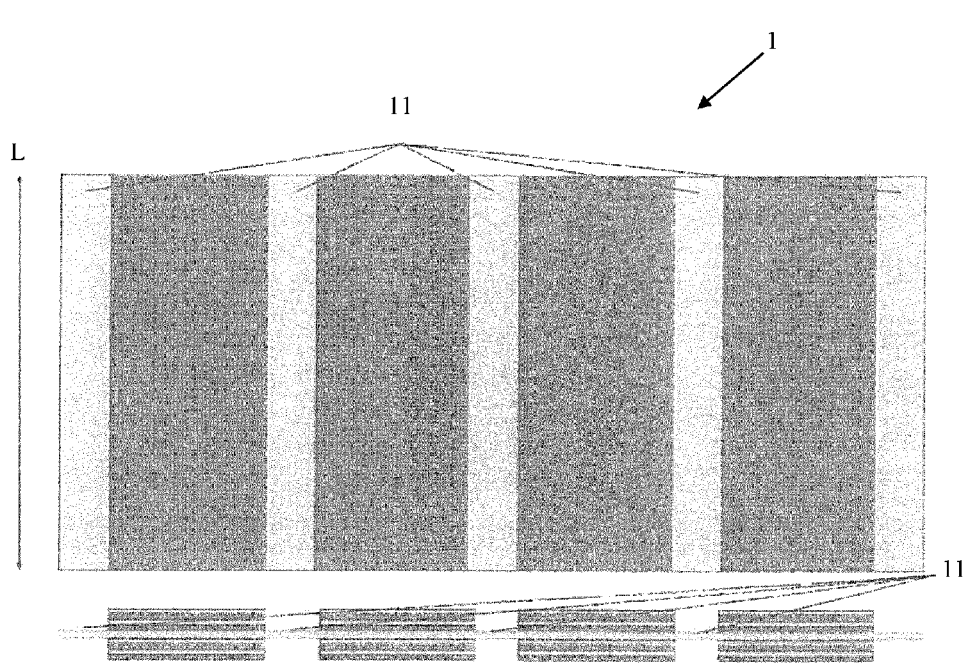

The present invention relates to a method and a device for coating strip-type, flexible, dielectric substrates, in particular for repeated coating of such substrates.

When strip-type substrates, such as a film, are coated on a coating roll, it is known to provide the substrate with charge before coating in order to improve the adhesion of the substrate on the coating roll. The substrate is charged, for example, with the aid of an electron beam, which is directed onto the substrate before contact with the coating roll. The charge causes a strong adhesion of the substrate on the roll, thereby significantly improving the cooling of the substrate during the coating process. This makes it possible to increase the coating rate and/or to reduce the thickness of the substrate. Such a method is known, for example, by the name SuperBias.

EP 1 686 197 B1 describes a vacuum vapor deposition method and a device, wherein the layer made of insulating material which is to be coated is brought into close contact with a cooling roll by means of charging.

The charging of the substrate requires a dielectric substrate; conducting substrates cannot be charged by the electron beam. This also applies to substrates provided with a metal coating in a preceding step. Such a coating also causes an intrinsically dielectric substrate to be conductive, which no longer allows subsequent charging or reduces the effect of previous charging.

For this reason, the advantages of the known methods can be achieved only in the case of a single coating, that is to say, only one-sided coating.

It is therefore an object of the invention to also achieve the advantageous effects of charging for substrates which have been metal-coated in a preceding process step. This is to make it possible in particular to also improve the coating process for processes in which a substrate is coated repeatedly, wherein at least one of the coating processes comprises coating with a metal coating, such as multiple or double-sided coatings. An improvement is thus also to be achieved for the coating process following a metal coating.

These objects are accomplished with the features of the invention according to the independent claims; the dependent claims define embodiments of the invention.

It is a basic idea of the present invention, in the case of the metal coating of a substrate, not to coat the substrate over its entire width, but to provide at least one longitudinal strip of the substrate along which no coating takes place. These strips of the substrate that are not provided with a metal layer can then maintain the previous charge or be provided with new charge, so that the adhesion of the substrate on the coating roll remains improved at least along the free strip. The subsequent further coating can then be carried out on the same surface or on the rear side, preferably again in the portions of the substrate coated during the first coating process.

In particular, the invention provides a method for coating a strip-type, flexible, dielectric substrate with a metal layer on a coating roll over which the substrate is guided in the longitudinal direction of the substrate during the coating process. To improve the adhesion of the substrate on the coating roll during the coating process, the substrate is charged. The substrate is coated with a first metal layer, wherein, in the longitudinal direction of the substrate, at least one free strip remains which is not coated with the metal layer, and the coated substrate provided with a second metal layer. The at least one free strip is preferably provided in an environment of at least one longitudinal edge of the substrate, wherein preferably at least two free strips remain, wherein the two longitudinal edges of the substrate are each encompassed by one of the free strips, and the free strips are spaced apart in the width direction by a distance which preferably remains constant in the longitudinal direction of the substrate.

Before step (b), a step (a1) for treating the portions of the surface of the substrate to be coated, on which portions the free strips are to remain, can be carried out in such a way that the application of the metal layer in the free strips is avoided. The treatment can comprise at least one of the following: applying oil, or other media that vaporize in a vacuum after a certain time, using a vaporization method or an offset printing method; covering by means of masking; action of an air stream to blow the metal vapor; suctioning the metal vapor; applying a protective medium; in situ vaporization of the metal layer; and creating regions of highly reduced conductivity.

In step (b), a surface of the substrate can be coated, wherein in step (c), the same surface of the substrate is coated with a further layer. Also, a surface of the substrate can be coated in step (b) and the surface of the substrate opposite the surface coated in step (b) can be coated in step (c).

Before step (c), portions of the opposite surface of the substrate to be coated in step (c), on which portions the free strips are to remain, can be treated in order to ensure that the free strips remain free,
wherein preferably the free strips of the opposite surface correspond to the portions of the surface remaining in step (b).

Further, the one surface of the substrate and the surface of the substrate opposite the surface coated in step (b) can be coated alternately with a first and optionally subsequent layers.

The method can further comprise coating the substrate with further metal layers.

Optionally, a step for re-charging the substrate can be carried out at least before one of the steps for coating the substrate with a second or further metal layer.

The substrate is coated in particular by means of a vacuum vapor deposition method.

The invention further provides a device for coating a strip-type, flexible dielectric substrate with a metal layer on a coating roll over which the substrate is guided in the longitudinal direction of the substrate during the coating process. The device comprises:
a device for charging the substrate to improve the adhesion of the substrate on the coating roll during the coating process,
a device for coating the substrate with a first metal layer, wherein the device is configured such that during the coating process in the longitudinal direction of the substrate at least one free strip remains which is not coated with the metal layer, and
a device for coating the coated substrate with a second metal layer.

The device can further comprise a device for applying a second metal layer on an opposite surface of the substrate. Further, a device for treating the portions of the surface of the substrate to be coated, on which portions the free strips are to remain, can be provided in such a way that the application of the metal layer in the free strips is avoided.

By means of the present invention, the advantage of charging a substrate can even be achieved in the case of a coating process of the substrate already provided with a metal coating.

The present invention is explained in more detail below with reference to the FIGURES; shown are FIG. 1 a schematic plan view and a side view of a strip substrate provided with a metal layer by the method according to the invention, and FIG. 2 a coating roll to illustrate a second coating process according to an embodiment of the present invention.

During coating, in particular in vacuum coating processes for coating film webs in the production of electronic components, such as, for example, when applying aluminum (Al) layers during battery production, or also in the packaging industry, the film to be coated (the substrate) is guided over rolls and the actual coating is carried out when the film is running over a coating roll. For example, the coating can be applied to the substrate by vapor deposition methods or sputtering methods.

Thus, in particular in the production of packaging films, but also of capacitors or electrodes in battery production, thicker metal layers, in particular Al layers, are increasingly required on comparatively thick substrates. Accordingly, the coating times should not increase substantially, even in the case of these thicker layers. For example, with previous methods, it is only possible to achieve coating rates on the web substrate of at most approximately 10 m/s with a layer thickness of 50 nm Al. However, particularly in battery production, there is now already a need for layer thicknesses of 500 nm to even 1.5 μm Al on films with a thickness of only 8 μm, for example in the production of current collectors. With existing vacuum coating methods, this is hardly achievable. The high coating rates increase the heat of condensation on the substrate, thereby increasing the heat input to the substrate, which must be dissipated during the coating process. Therefore, methods are required which allow an increase in the cooling possibilities of the coating roll.

By charging the substrate before coating, for example by charging the substrate with an electron beam on the side facing away from the roll, the adhesion of the substrate on the coating roll is improved by electromagnetic force. The heat of condensation produced during the coating process can thus be released better over the roll.

In dielectric substrates, this is achieved successfully for a first coating process. However, it is often necessary, particularly in the case of the aforementioned application fields, to apply two or more metal layers to the substrate and/or to provide both sides of the substrate with a metal layer. An example of this can be the production of a cathode/anode pair. However, if a metal layer is applied to the substrate, the substrate has lost its dielectric nature and it is no longer possible to apply charge to the substrate.

According to the invention, in order to also allow the adhesion of already metal-coated substrates on the coating roll by means of the charging device already used for the first coating process to also be able to be used for a further coating, at least one free strip is left free during coating with the metal layer in the longitudinal direction of the substrate. The metal coating is therefore not applied over the entire width of the substrate, but along at least one strip, preferably at least two or more strips, so that a region, which can receive the previously applied charge and/or to which charge can be applied in a further charge process, remains on the substrate. The adhesion on the coating roll can thus be improved at least in the free strips and thus the heat transfer to the roll can be ensured.

A correspondingly coated substrate 1 is shown schematically in FIG. 1 in a plan view and a side view. Along the longitudinal direction L of the substrate 1 to be coated, which can be provided in the form of a web with a length of up to several kilometers, strips 12 are provided with the coating, while strips 11 lying therebetween are kept free (free strips 11). The strips 11 or regions remaining free must be wide enough, on the one hand, to ensure sufficient adhesion of the partially metal-coated substrate 1; on the other hand, the width of the strips 11 should be selected to be as narrow as possible since the regions which remain free are not available for the production of the desired product later.

In order to avoid coating the substrate in the desired regions, the corresponding regions can be treated before coating. For example, an oil layer can be applied before the coating process in the region of the strips 11 that are not to be coated. This can preferably be carried out by means of an offset printing process. The use of an oil evaporation process, for example in the form of a strip oil evaporator, is also possible. In general, the use of oil is preferred since oil (or other suitable hydrocarbons) evaporates after a certain time in a vacuum, without damaging the substrate. Such substances evaporate during the subsequent coating in a vacuum and/or by heating the boundary layer during the coating process.

At the points at which the oil layer was applied, the substrate cannot be permanently metallized, and previously applied charges are maintained in these regions. In a subsequent coating process, these regions keep the substrate on the coating roll, despite the metal coating having been carried out in the other regions.

Other possibilities for preventing a metal coating locally on the substrate 1 are, for example, covering the corresponding regions by means of masking or applying a protective medium or the targeted action of an air flow for blowing or suctioning the metal vapor. Further, an already applied metal layer can also be vaporized specifically in situ in the corresponding regions of the strips 11 which are to be kept free, for example by the action of a local heat source, such as an IR laser. In addition, regions of highly reduced conductivity, in which the metal is applied reactively dielectrically in the region of the free strips 11, can be created prior to the coating in the corresponding strips 11.

The method according to the invention can also be carried out several times in succession, wherein, after local processing to prevent the coating and subsequent coating in each case the substrate in turn, preferably in the same regions as in the first process, local regions are provided in which the coating is to be avoided, and subsequently the substrate is coated again. Thus, not only can the coating itself be effected several times in succession, but also the intermediate treatment steps of the regions not provided for the coating, such as, for example, the oil application by means of a strip oil evaporator.

Furthermore, the coating device for coating both the front and the rear side of a substrate in one working step can also be a further device for applying a metal layer, i.e., in particular a second coating roll, and optionally also a second device for treating the substrate also on the rear side to prevent a coating in the regions that are to be kept free.

For example, in the case of a substrate which is approximately 20 cm wide, four strips, each approximately 3-4 cm and each separated from strips remaining free of approximately 1 cm, can be applied. Also possible is the use of substrates which, for example, are 600 to 700 mm wide and 1.3 to 1.7 m in length. This can be used, for example, in the production of batteries, which are intended to be a certain size, for example approximately equal to A4 or A5 size, wherein the width of the strips can then be adapted accordingly.

Preferably, free strips 11 remain in the longitudinal direction of the substrate 1 at the two edges. Preferably, the strip pattern is formed symmetrically on the substrate. The substrate can also be treated from both sides such that the same regions of coating remain free on the front and rear sides. This is particularly preferred in cases where a metal coating is to be applied on both sides of the substrate 1. This results in regions which, despite the substrate 1 being turned for dual-sided coating or multiple coatings, are always kept free of metal coating on both sides. Despite being turned, these regions repeatedly increase the adhesion and continually trap air pockets, which maintain optimal cooling, which will now be explained in more detail with reference to FIG. 2.

Figure 2:
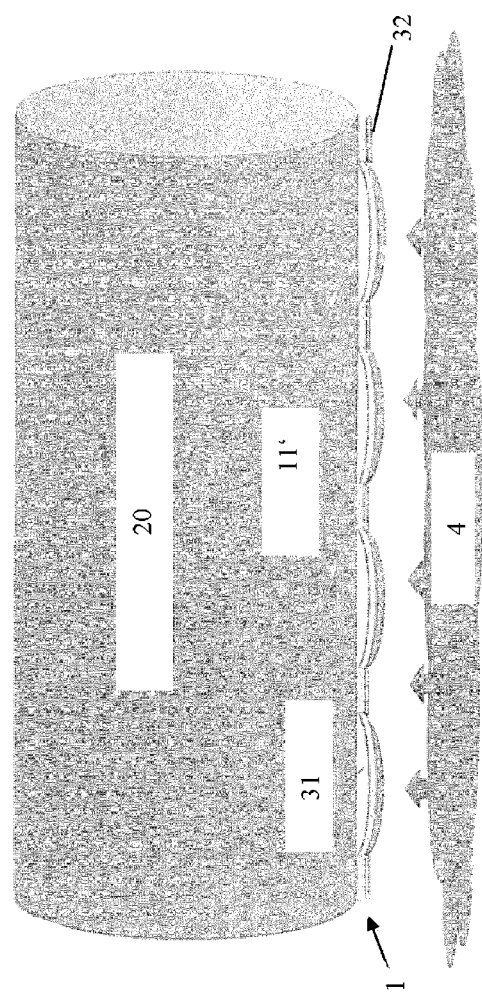

FIG. 2 schematically shows a coating roll 20 over which a substrate 1 already coated once with a metal layer in a first coating process according to the invention is guided. In the strip-type regions in which the metal layer is applied, the effect of the adhesion of the substrate 1 on the coating roll 20 is no longer provided by the charge already applied before the first coating or also newly applied after the first coating. Instead, air pockets 31 are formed in these regions between the roll 20 and the substrate 1. As described above, the air pockets 31 thus formed support the cooling of the substrate 1. In these regions, a gaseous medium for increasing the effect of a gas pocket can be introduced by means of a suitable method.

An oil film 32 which prevents coating of the substrate in these regions 11' has been applied in the other regions 11' of the substrate 1. There, the substrate 1 adheres to the roll 20, so that the air pockets/gas pockets 31 can be formed in the intermediate regions in order to ensure cooling and to ensure an optimal coating from the metal vapor 4 provided in the roll environment.

In addition to the method, the present invention therefore also provides a corresponding device for coating substrates using a device for charging the substrate, in particular by means of an electron beam, a device for treating the substrate to ensure that the desired free strips are not coated, for example a device for local application of a thin oil film, and finally a device for coating the substrate on a surface, in particular with a coating roll, for example a vacuum vapor deposition device. After the first coating has been carried out, the coating device, and optionally also the device for charging and/or treating, can then be used a further time making use of the advantages of the incomplete metal coating for a second and optionally further coatings on the same or also the opposite side, or, as already noted above, in each case second devices can be provided in order to apply a first and second coating in one process step, in particular on the front and rear sides of the substrate.

Although the invention is illustrated and described in detail by means of figures and the associated description, this illustration and this detailed description are to be understood as illustrative and exemplary, and not as limiting the invention. It is understood that those skilled in the art may make changes and modifications without departing from the scope of the following claims. In particular, the invention also comprises embodiments having any combination of features that are mentioned or shown above with respect to various aspects and/or embodiments.

The invention also includes individual features in the figures, even if they are shown there in connection with other features and/or are not mentioned above.

Further, the term "to comprise" and derivatives thereof do not exclude other elements or steps. Likewise, the indefinite article "a" or "an" and derivatives thereof do not exclude a plurality. The functions of a plurality of features listed in the claims may be fulfilled by one unit. The terms "substantially," "around," "approximately," and the like in conjunction with a property or a value also define in particular precisely the property or precisely the value. None of the reference signs in the claims are to be understood as limiting the scope of the claims.

The invention claimed is:

1. A method for coating a strip-type, flexible, dielectric substrate with a metal layer on a coating roll over which the substrate is guided in the longitudinal direction (L) of the substrate during the coating process, comprising the steps of:

(a) charging the substrate to improve adhesion of the substrate on the coating roll during the coating process, (b) coating the substrate with a first metal layer, wherein, in the longitudinal direction (L) of the substrate, at least one free strip remains which is not coated with the metal layer, (c) coating the coated substrate with a second metal layer, wherein the method has a step for re-charging the substrate at least before one of the steps for coating the substrate with the second metal layer or a further metal layer, wherein, during coating of the coated substrate in step (c) an air pocket is formed between the coating roll and the portions of the substrate coated in step (b) to support cooling of the substrate, wherein a gaseous medium is introduced in these portions to increase the cooling effect of the air pocket.

2. The method according to claim 1, wherein the at least one free strip is provided in an environment of at least one longitudinal edge of the substrate.

3. The method according to claim 1, wherein at least two free strips remain, wherein the two longitudinal edges of the substrate are each encompassed by one of the free strips, and the free strips are spaced apart in the width direction by a distance which remains constant in the longitudinal direction (L) of the substrate.

4. The method according to claim 1, further comprising a step (a1) carried out before step (b) for treating the portions of the surface of the substrate to be coated, on which portions the free strips are to remain, in such a way that the application of the metal layer in the free strips is avoided, wherein the treatment comprises at least one of the following:

applying oil or other media that vaporize in a vacuum after a certain time, using a vaporization method or an offset printing method;

covering by means of masking;

action of an air flow to blow a metal vapor;

suctioning a metal steam;

applying a protective medium;

in-situ evaporation of the metal application; and creating regions of reduced conductivity.

5. The method according to claim 1, wherein a surface of the substrate is coated in steps (b) and the surface of the substrate opposite the surface coated in step (b) is coated in step (c).

6. The method according to claim 5, wherein, before step (c), portions of the opposite surface of the substrate to be coated in step (c), on which portions the free strips are to remain, are treated in order to ensure that the free strips remain free, wherein the free strips of the opposite surface correspond to the portions of the surface remaining in step (b).

7. The method according to claim 5, wherein the surface of the substrate coating in step (b) and the surface of the substrate opposite the surface of the substrate coated in step (b) are coated alternately with a first and optionally subsequent layers.

8. The method according claim 1, wherein the method further comprises coating the substrate with further metal layers.

9. The method according to claim 1, wherein the substrate is coated by means of a vacuum vapor deposition method.

\* \* \* \* \*